United States Patent [19]
Nakada

[11] Patent Number: 5,430,685
[45] Date of Patent: Jul. 4, 1995

[54] MULTI-PORT RANDOM ACCESS MEMORY DEVICE HAVING MEMORY CELL REWRITABLE THROUGH SINGLE INPUT PORT

[75] Inventor: Toshio Nakada, Kanagawa, Japan

[73] Assignee: NEC Corporation, Tokyo, Japan

[21] Appl. No.: 270,837

[22] Filed: Jul. 5, 1994

[30] Foreign Application Priority Data

Jul. 5, 1993 [JP] Japan .................................. 5-164934

[51] Int. Cl.⁶ .............................................. G11C 7/00
[52] U.S. Cl. ...................... 365/230.05; 365/189.04; 365/189.02; 365/230.02
[58] Field of Search .............. 365/154, 189.04, 230.05, 365/230.02, 189.02

[56] References Cited

U.S. PATENT DOCUMENTS 5,191,553  3/1993  Mizoguchi ................ 365/230.05 X
5,197,035  3/1993  Ito ............................. 365/230.05

FOREIGN PATENT DOCUMENTS

2-62788  3/1990  Japan.

Primary Examiner—Joseph A. Popek
Assistant Examiner—Son Mai
Attorney, Agent, or Firm—Sughrue, Mion, Zinn, Macpeak & Seas

[57] ABSTRACT

A random access memory cell of a multi-port random access memory device has a single input port coupled with a single digit line pair and controlled by a common word line, and write address signals and write-in data bits are multiplexed so that the single input port transfers the write-in data bits to the memory nodes of the random access memory cell.

6 Claims, 6 Drawing Sheets

MULTI-PORT RANDOM ACCESS MEMORY DEVICE HAVING MEMORY CELL REWRITABLE THROUGH SINGLE INPUT PORT

FIELD OF THE INVENTION

This invention relates to a multi-port random access memory device and, more particularly, to a multi-port random access memory cell incorporated therein with a single input port shared between a plurality of write-in data paths.

DESCRIPTION OF THE RELATED ART

Figure 1:
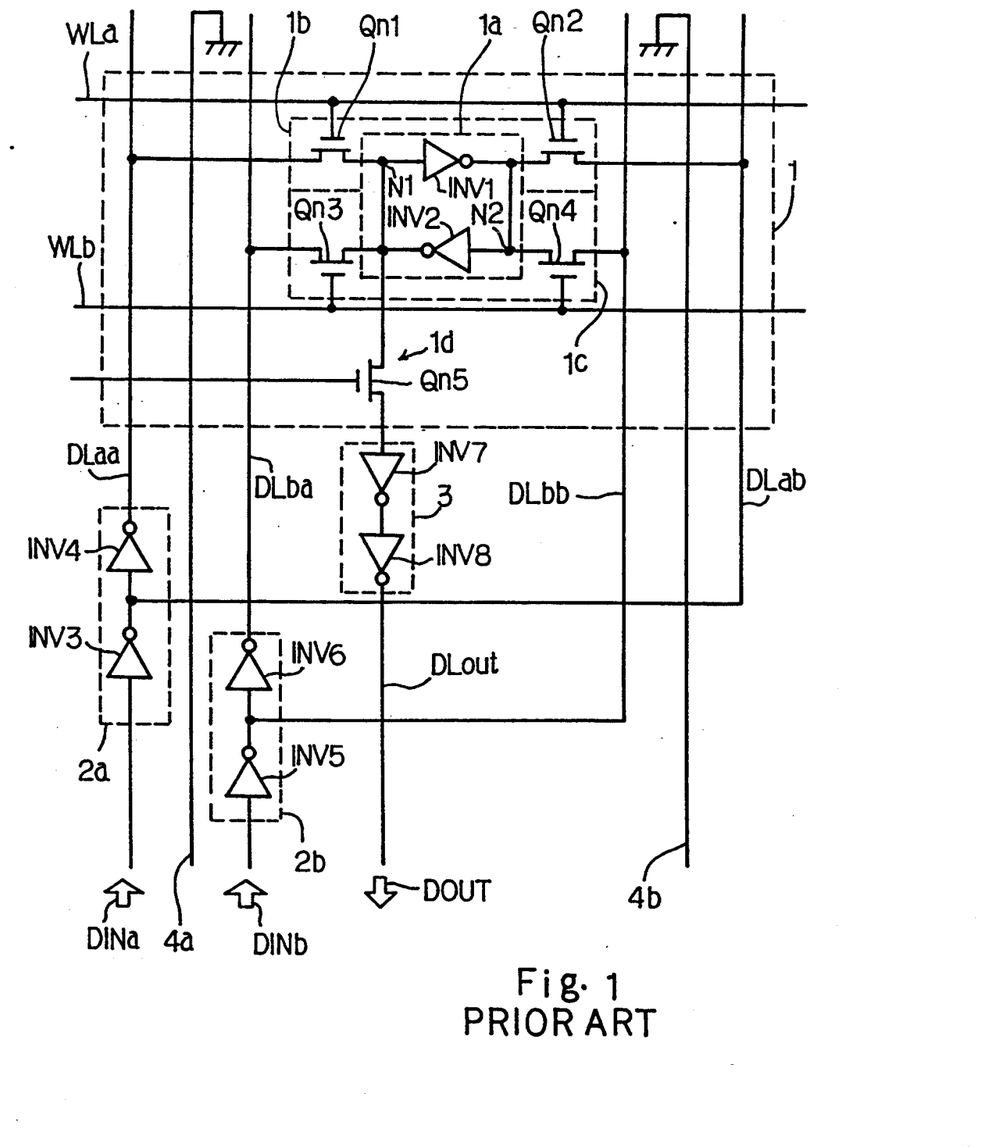
FIG. 1 is a circuit diagram showing the arrangement of the prior art three-port random access memory cell.

A typical example of the multi-port random access memory cell is illustrated in FIG. 1 of the drawings, and is a three-port random access memory cell 1. The three-port random access memory cell 1 is associated with two write-in circuits 2a and 2b and a single read-out circuit 3, and the three-port random access memory cell 1 comprises a memory circuit 1a implemented by two inverters INV1 and INV2, a first input port 1b implemented by a pair of n-channel enhancement type transfer transistors Qn1 and Qn2, a second input port 1c also implemented by a pair of n-channel enhancement type transfer transistors Qp3 and Qp4 and an output port 1d implemented by a single n-channel enhancement type transfer transistor Qn5.

The input node of one of the inverters INV1 and INV2 is coupled to the output node of the other of the inverters INV1 and INV2, and, accordingly, the inverters INV1 and INV2 thus arranged in a loop stores a data bit in the form of potential difference between the output node N1 of the inverter INV1 and the output node N2 of the inverter INV2. The output node N1 is connected to the source/drain nodes of the n-channel enhancement type transfer transistors Qn1 and Qn3, and the output node N2 is connected to the source/drain nodes of the n-channel enhancement type transfer transistors Qn2 and Qn4.

Two pairs of digit lines DLaa/DLab and DLba/DLbb are respectively associated with the first input port 1b and the second input port 1c, and respectively propagate write-in data bits to the first input port 1b and the second input port 1c in the form of potential difference.

The digit lines DLaa and DLab are coupled to the source/drain node of the n-channel enhancement type transfer transistor Qn1 and the source/drain node of the n-channel enhancement type transfer transistor Qn2, respectively, and the other digit lines DLba and DLbb are similarly coupled to the source/drain node of the n-channel enhancement type transfer transistor Qn3 and the source/drain node of the n-channel enhancement type transfer transistor Qn4. Therefore, while the n-channel enhancement type transfer transistors Qn1/Qn2 and Qn3/Qn4 are turned off, the memory circuit 1a is isolated from the digit lines DLaa/DLab and DLba/DLbb. On the other hand, if one of the two pairs of n-channel enhancement type transfer transistors Qn1/Qn2 and Qn3/Qn4 turn on, the memory circuit 1a or the output nodes N1/N2 of the inverters INV-1/INV2 are connected to either pair of digit lines DLaa/DLab or DLba/DLbb.

In order to prevent the digit line pairs DLaa/DLab and DLba/DLbb from a cross-talk, shield lines 4a and 4b are provided between the digit line DLaa and the digit line DLba and between the digit line DLab and the digit line DLbb.

The write-in circuit 2a is implemented by a series of inverters INV3 and INV4, and the inverters INV3 and INV4 produce a potential difference between the digit lines DLaa and DLab from a write-in data bit DINa of either high or low voltage level. Similarly, inverters INV5 and INV6 coupled in series form in combination the other write-in circuit 2b, and produces a potential difference between the digit lines DLba and DLbb from a write-in data bit DIINb of either high or low voltage level.

Two word lines WLa and WLb are provided for the three-port random access memory cell 1, and are coupled to the gate electrodes of the n-channel enhancement type transfer transistors Qn1 and Qn2 and the gate electrodes of the n-channel enhancement type transfer transistors Qn3 and Qn4, respectively. In other words, the first input port 1b and the second input port 1c are opened and closed by using the word lines WLa and WLb.

If the word line WLa is lifted to an active high voltage level, the n-channel enhancement type transfer transistors Qn1 and Qn2 turn on, and the potential difference indicative of the write-in data bit DINa is transferred from the associated digit lines DLaa and DLab through the first input port 1b to the memory circuit 1a. On the other hand, if the other word line WLb is elevated to the active high voltage level, the other pair of n-channel enhancement type transfer transistors Qn3/Qn4 turns on, and the potential difference indicative of the write-in data bit DINb is transferred from the associated digit line pair DLba/DLbb through the second input port 1c to the memory circuit 1a.

The output node N1 of the inverter INV2 is coupled to the source/drain node of the n-channel enhancement type transfer transistor Qn5, and the other source/drain node of the n-channel enhancement type transfer transistor Qn5 is connected to the read-out circuit 3. Inverters INV7 and INV8 are coupled in series to the output port 1d, and produces a read-out data signal DOUT on a read-out data line DLout from the potential level at the output node N1.

Figure 2:
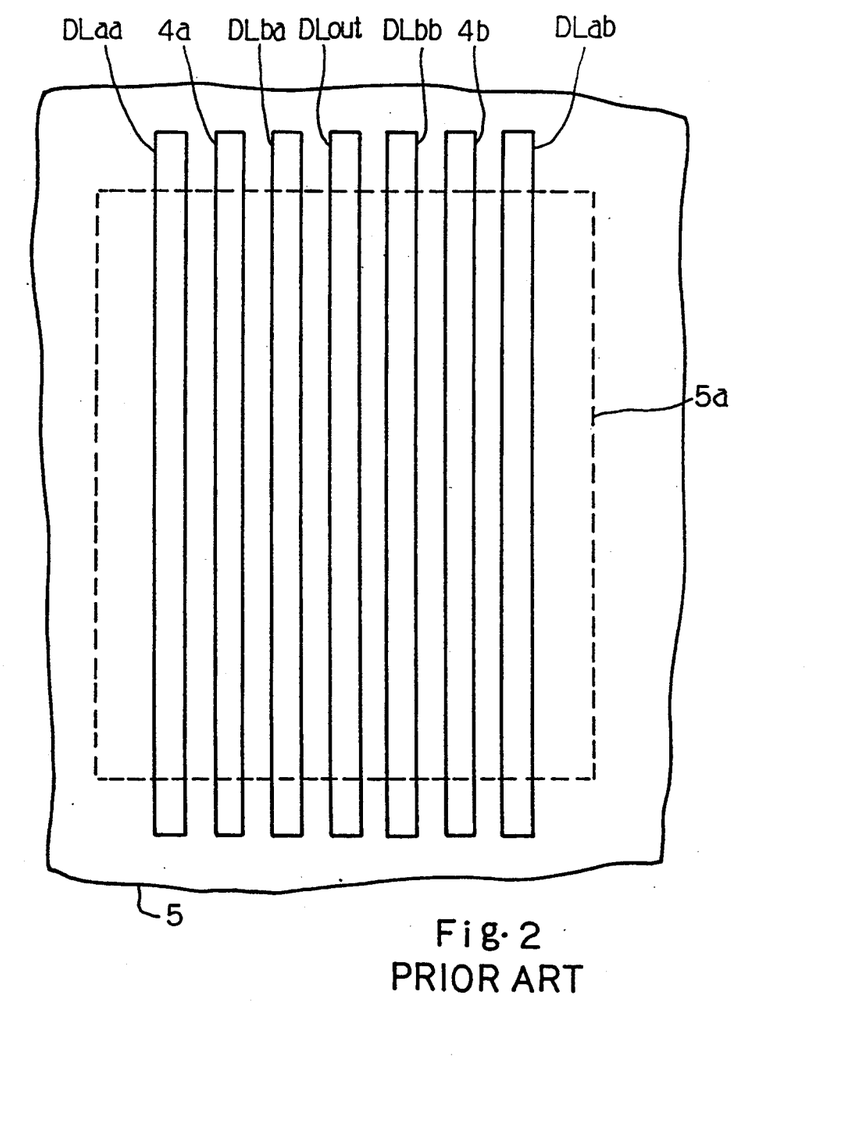
FIG. 2 is a plan view showing the layout of the signal lines and the shield lines passing over the prior art three-port random access memory cell.

The three-port random access memory cell 1 forms a part of a memory cell array of a random access memory device fabricated on a single semiconductor substrate 5, and the three-port random access memory cell 1 is assumed to be assigned to a generally rectangular area 5a as shown in FIG. 2. In this instance, the generally rectangular area 5a measures 20 microns by 20 microns.

As described hereinbefore, three-port random access memory cell 1 requires the two digit lines DLaa/DLab, the two shield lines 4a/4b, the read-out data line DLout and the other digit lines DLba/DLbb, and the seven signal lines DLaa/DLab, 4a/4b, DLout and DLba/DLbb pass over the generally rectangular area 5a. If the input ports are increased, the signal lines are increased by twice as large as the increased input ports, and the number of n-channel enhancement type transfer transistors is also increased by twice as large as the increased input ports. Moreover, the shield lines 4a/4b are indispensable for the pairs of digit lines DLaa/DLab and DLba/DLbb, and the shield lines are also increased by twice as large as the increased input ports. Therefore, a problem inherent in the prior art multi-port random access memory device is that the input ports are hardly increased.

SUMMARY OF THE INVENTION

It is therefore an important object of the present invention to provide a multi-port random access memory cell which occupies a small amount of real estate.

To accomplish the object, the present invention proposes to form time slots assigned to write-in data paths synchronism with associated word lines.

In accordance with the present invention, there is provided a multi-port random access memory device fabricated on a semiconductor chip, comprising: a) a plurality of addressable memory cells for storing data bits in a rewritable manner, and each having a-1) a memory circuit for storing one of the data bits, a-2) a single input port coupled to the memory circuit and responsive to a write address signal on a common word line for transferring a write-in data bit to the memory circuit, and a-3) an output port coupled to the memory circuit and responsive to a read address signal for delivering the data bit from the memory circuit; b) a plurality of sets of word lines respectively driven with a plurality of write address signals for independently addressing the plurality of addressable memory cells, and rearranged into a plurality of groups of word lines, each of the word lines of each group being selected from one of the plurality sets of word lines for addressing one of the plurality of addressable memory cells; c) a plurality of sets of write-in data paths respectively associated with the plurality of sets of word lines for propagating a plurality of write-in data bits to the plurality of addressable memory cells independently from one another, and rearranged into a plurality of groups of write-in data paths, each of the write-in data paths of each group being selected from one of the plurality of sets of write-in data paths for one of the plurality of addressable memory cells; d) a plurality of first multiplexers respectively associated with the plurality of groups of word lines, and each responsive to a clock signal for producing the write-in address signal from each of the plurality of write address signals; and e) a plurality of second multiplexers respectively associated with the plurality of groups of write-in data paths, and each responsive to the clock signal for producing the write-in data bit from each of the plurality of write-in data bits in synchronism with the plurality of first multiplexers.

BRIEF DESCRIPTION OF THE DRAWINGS

The features and advantages of the multi-port random access memory cell according to the present invention will be more clearly understood from the following description taken in conjunction with the accompanying drawings in which.

DESCRIPTION OF THE PREFERRED EMBODIMENTS

First Embodiment

Figure 3:
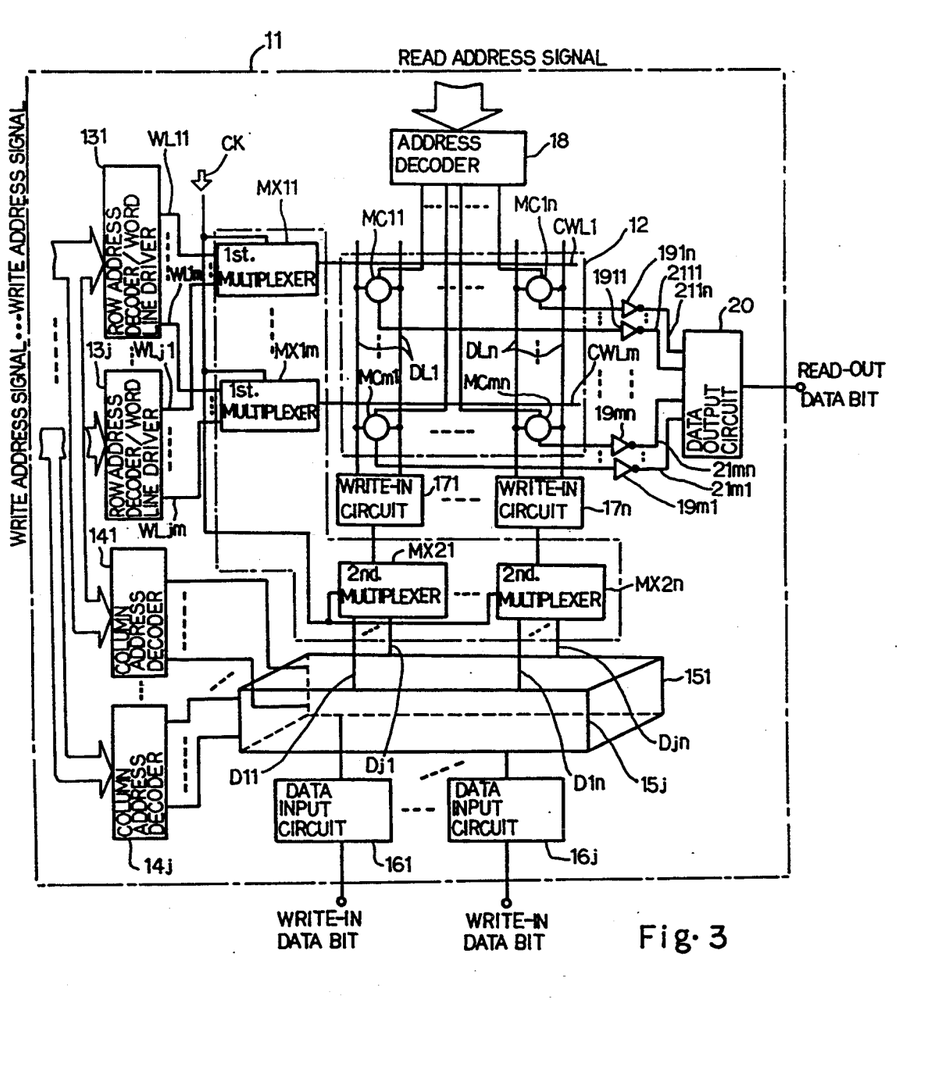
FIG. 3 is a block diagram showing the arrangement of a multi-port random access memory device according to the present invention.

Referring to FIG. 3 of the drawings, a multi-port random access memory device embodying the present invention is fabricated on a semiconductor chip 11, and largely comprises a memory cell array 12, a plurality of sets of word lines WL11 to WL1m, ... and WLj1 to WLjm, a plurality of sets of write-in data lines D11 to D1n, ... and Dj1 to Djn, a plurality of first multiplexers MX11 to MX1m and a plurality of second multiplexers MX21 to MX2n. The memory cell array 12 is implemented by a plurality of random access memory cells MC11, ..., MC1n, ..., MCm1, ... and MCmn arranged in rows and columns, and data bits are stored in the random access memory cells MC11 to MCmn, respectively.

The multi-port random access memory device further comprises a plurality of row address decoder/word line driver units 131 to 13j respectively associated with the plurality of sets of word lines WL11-WL1m to WLj1-WLjm, and each of the plurality of row address decoder/word line driver units 131 to 13j is responsive to a write address signal supplied from the outside of the semiconductor chip for selectively driving the word lines of the associated set. The plurality of sets of word lines WL11-WL1m to WLj1-WLjm are rearranged into a plurality of groups of word lines WL11-WL1m, ... and WLj1-WLjm, and the plurality of groups of word lines WL11-WL1m to WLj1-WLjm are respectively coupled to the first multiplexers MX11 to MX1m. If all of the write address signals are indicative of the row address assigned to one of the rows of random access memory cells MC11-MC1n to MCm1-MCmn, all of the word line of the associated group are driven to an active high voltage level.

The multi-port random access memory device further comprises a plurality of common word lines CWL1 to CWLm coupled between the plurality of first multiplexers MX11 to MX1m and the rows of random access memory cells MC11-MC1n to MCm1-MCmn, and the first multiplexers MX11 to MX1m respectively drive the common word lines CWL1 to CWLm, respectively.

The multi-port random access memory device further comprises a plurality of column decoders 141 to 14j respectively associated with the plurality sets of write-in data lines D11-D1n to Dj1-Djn and responsive to the write address signals, a plurality of selectors 151 to 15j respectively coupled to the plurality sets of write-in data lines D11-D1n to Dj1-Djn and controlled by the plurality of column address decoders 141 to 14j and a plurality of data input circuits 161 to 16j for receiving a plurality of write-in data bits. The plurality of sets of write-in data lines D11-D1n to Dj1-Djn are rearranged into a plurality groups of write-in data lines D11-Dj1 to D1n -Djn, and the plurality groups of write-in data lines D11-Dj1 to D1n -Djn are coupled between the column selectors 151 to 15j and the associated second multiplexers MX21 to MX2n. The write-in data bits are independently supplied to the data input circuits 161 to 16j, and the data input circuits 161 to 16j transfer the write-in data bits to the column selectors 151 to 15j. If all of the write address signals are indicative of a column address assigned to one of the column of the random access memory cells, the column selectors 151 to 15j transfer the write-in data bits from the data input circuits 161 to 16j to the associated group of write-in data lines.

A clock signal CK is supplied to the plurality of first multiplexers MX11-MX1m and the plurality of second multiplexers MX21 to MX2n, and synchronizes the plurality of first multiplexers MX11-MX1m with the plurality of second multiplexers MX21 to MX2n as will be described hereinlater.

The multi-port random access memory device further comprises a plurality of write-in circuits 171 to 17n respectively coupled to the plurality of second multiplexers MX21 to MX2n and a plurality of digit line pairs DL1 to DLn respectively coupled to the columns of random access memory cells MC11-MCm1 to MC1n-MCmn. The write-in circuits 171 to 17n propagate the write-in data bits in the form of potential difference to the selected row of memory cells MC11-MC1n to MCm1-MCmn, respectively, and the write-in data bits are stored in the random access memory cells assigned the addresses indicated by the write address signals, respectively.

The multi-port random access memory device further comprises an address decoder 18 responsive to a read address signal for selecting one of the random access memory cells MC11 to MCmn, a plurality of read-out circuits 1911 to 19mn respectively associated with the random access memory cells MC11 to MCmn and a data output circuit 20 for delivering a read-out data bit to the outside of the semiconductor chip 11.

Figure 4:
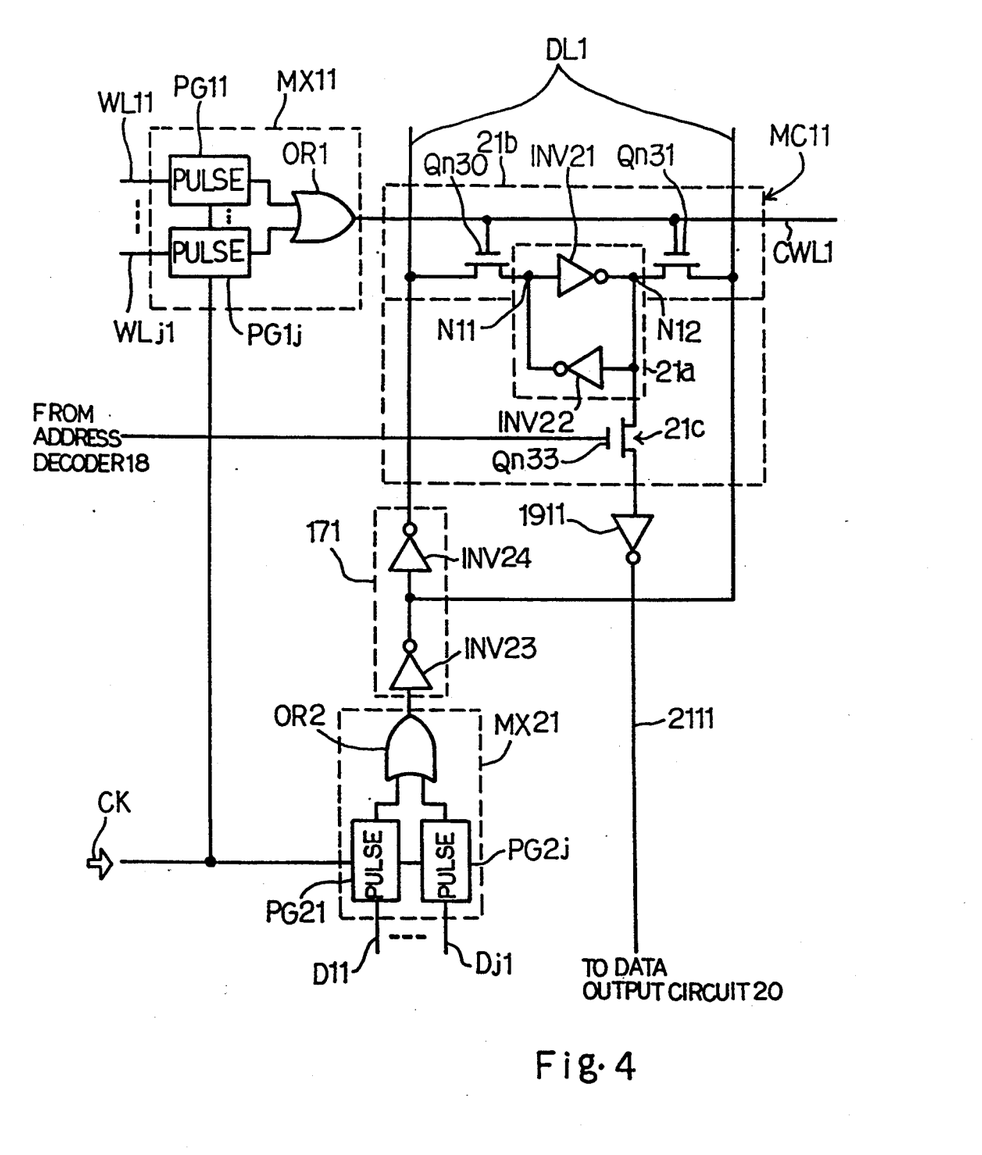
FIG. 4 is a circuit diagram showing the arrangement of a random access memory cell incorporated in the multi-port random access memory device shown in FIG. 3.

Turning to FIG. 4 of the drawings, all of the random access memory cells MC11 to MCmn are similar in circuit arrangement to one another, and each random access memory cell such as MC11 comprises a memory circuit implemented by two inverters INV21 and INV22, a single input port 21b coupled between the associated digit lines DL1 and a pair of memory nodes N11 and N12 and an output port 21c coupled between the memory node N12 and the readout circuit 1911. The single input port 21b is implemented by a pair of n-channel enhancement type transfer transistors Qn30 and Qn31 gated by the associated common word line CWL1, and the output port 21c is implemented by an n-channel enhancement type transfer transistor Qn33 gated by the address decoder 18.

The first multiplexers MX11 to MX1m are similar in circuit arrangement to one another, and each first multiplexer MX11 comprises a plurality of one-shot pulse generators PG11 to PG1j and an OR gate OR1. The one-shot pulse generators PG11 to PG1j are enabled with the clock signal CK, and are responsive to the address signal on the associated word lines WL11 to WL1l, respectively.

The second multiplexers MX21 to MX2n are also similar in circuit arrangement to one another, and each second multiplexer MX21 comprises a plurality of one-shot pulse generators PG21 to PG2j and an OR gate OR2. The one-shot pulse generators PG21 to PG2j are enabled with the clock signal CK, and are responsive to the write-in data bits on the associated write-in data lines Dl1 to Dj1. If the write-in data bit is logic "0" level corresponding to the low voltage level, the enabled one-shot pulse generator keeps the output node thereof low. On the other hand, if the write-in data bit is logic "1" level corresponding to the high voltage level, the enabled one-shot pulse generator shifts the output node thereof to the high voltage level. The one-shot pulse generators PG11 to PG1j are respectively associated with the one-shot pulse generators PG21 to PG2j, and are synchronously enabled with the clock signal.

The write-in circuits 171 to 17n are similar to one another, and each write-in circuit is implemented by a series of inverters INV23 and INV24, and produces a potential difference on the associated digit line pair from the write-in data bit.

The read-out circuit 1911 to 19mn are similar to one another, and each read-out circuit is implemented by an inverter. The inverters 1911 to 19mn drive read data lines 2111 to 21mn, respectively.

Figure 5:
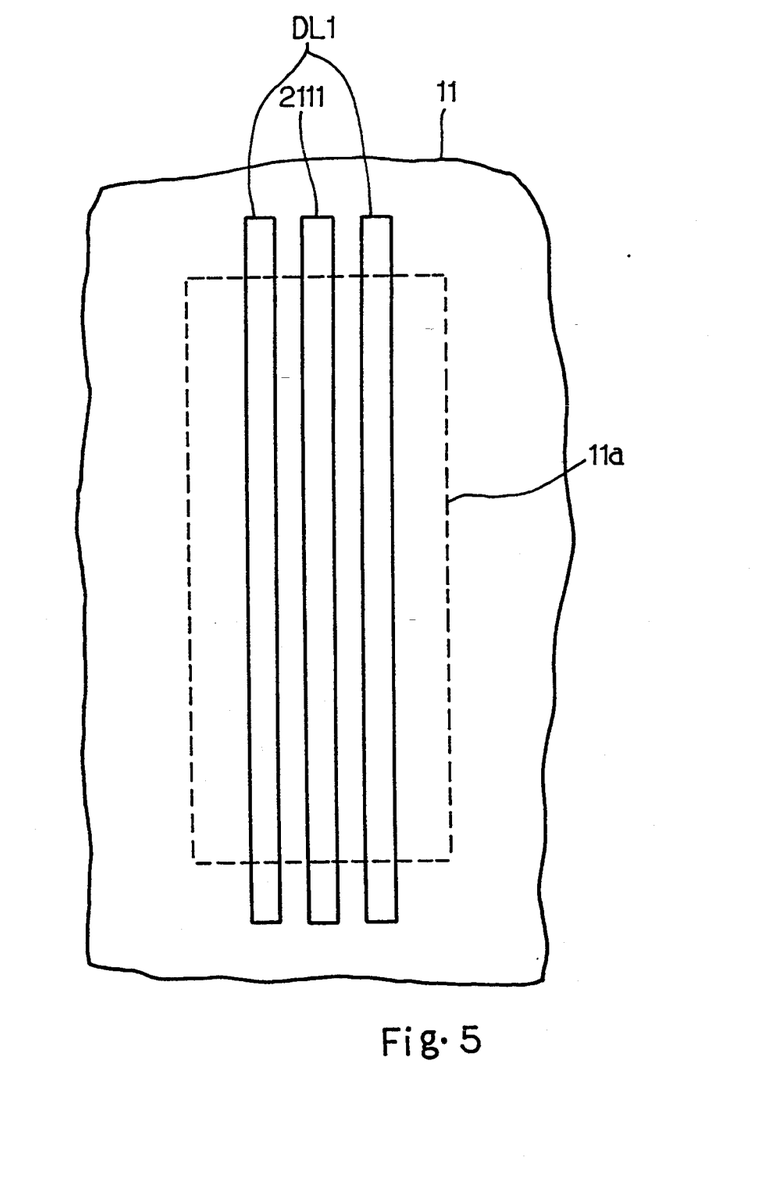
FIG. 5 is a plan view showing the layout of signal lines passing over the random access memory cell.

Thus, only three signal lines DL1 and 2111 are required for each random access memory cell as shown in FIG. 5, and the only one input port 21b is shared between the data input circuits 161 to 16j. Moreover, any shield line is not required, and an area 11a assigned to each memory cell measures 20 microns by 5 microns.

Though not shown in the drawings, an arbiter is incorporated in the multi-port random access memory device, and prevents the memory cell array 12 from a collision between a write-in data bit and read-out data bit.

Description is hereinbelow made on circuit behaviors of the multi-port random access memory device on the assumption that the random access memory cell MC11 is selected from the memory cell array 12.

Assuming now that an external device supplies the write address signal indicative of the address assigned to the memory cell MC11 and the write-in data bit of logic "1" level to the row address decoder/word line driver unit 131 and the data input circuit 161, the row address decoder/word line driver unit 131 shifts the word line WL11 to the high voltage level, and the column address decoder unit 141 causes the selector unit 151 to couple the data input circuit 161 to the second multiplexer MX21.

The one-shot pulse generator PG11 of the first multiplexer MX11 generates the one-shot pulse in synchronism with the clock signal CK, and the one-shot pulse causes the OR gate OR1 to shift the common word line CWL1 to the active high voltage level. The one-shot pulse generator PG21 supplies the one-shot pulse indicative of the write-in data bit of logic "1" level to the OR gate OR2 in synchronism with the clock signal CK, and the OR gate transfers the write-in data bit of logic "1" level to the write-in circuit 171. The write-in circuit 171 produces the potential difference on the digit line pair DL1 from the write-in data bit.

The common word line CWL1 allows the n-channel enhancement type transfer transistors Qn30 and Qn31 to turn on, and the potential difference synchronously produced is transferred through the n-channel enhancement type transfer transistors Qn30 and Qn31 to the memory nodes N11 and N12.

Subsequently, if another external device supplies the write address signal indicative of the address assigned to the memory cell MC11 and the write-in data bit of logic "1" level to the row address decoder/word line driver unit 13j and the data input circuit 16j, the row address decoder/word line driver unit 13j shifts the word line WLj1 to the high voltage level, and the column address decoder unit 14j causes the selector unit 15j to couple the data input circuit 16j to the second multiplexer MX21.

The one-shot pulse generator PG1j of the first multiplexer MX11 generates the one-shot pulse in synchronism with the clock signal CK, and the one-shot pulse causes the OR gate OR1 to shift the common word line CWL1 to the active high voltage level. The one-shot pulse generator PG2j of the second multiplexer MX21 supplies the one-shot pulse indicative of the write-in data bit of logic "1" level to the OR gate OR2 in synchronism with the clock signal CK, and the OR gate transfers the write-in data bit of logic "1" level to the write-in circuit 171. The write-in circuit 171 produces the potential difference on the digit line pair DL1 from the write-in data bit.

The common word line CWL1 allows the n-channel enhancement type transfer transistors Qn30 and Qn31 to turn on, and the potential difference synchronously produced is transferred through the n-channel enhancement type transfer transistors Qn30 and Qn31 to the memory nodes N11 and N12.

If the external device accesses the data bit stored in the random access memory cell MC11 with the read address signal, the address decoder 18 decodes the read address signal, and supplies the high voltage level to the gate electrode of the n-channel enhancement type transfer transistor Qn33. The n-channel enhancement type transfer transistor Qn33 turns on, and the voltage level at the memory node N12 is transferred to the read-out circuit 1911. The data output circuit 20 produces an output data signal indicative of the read-out data bit, and supplies it to the external device.

As will be appreciated from the foregoing description, the random access memory cell has only one input port shared between a plurality of write-in data bits, and occupies a small amount of real estate.

Second Embodiment

Figure 6:
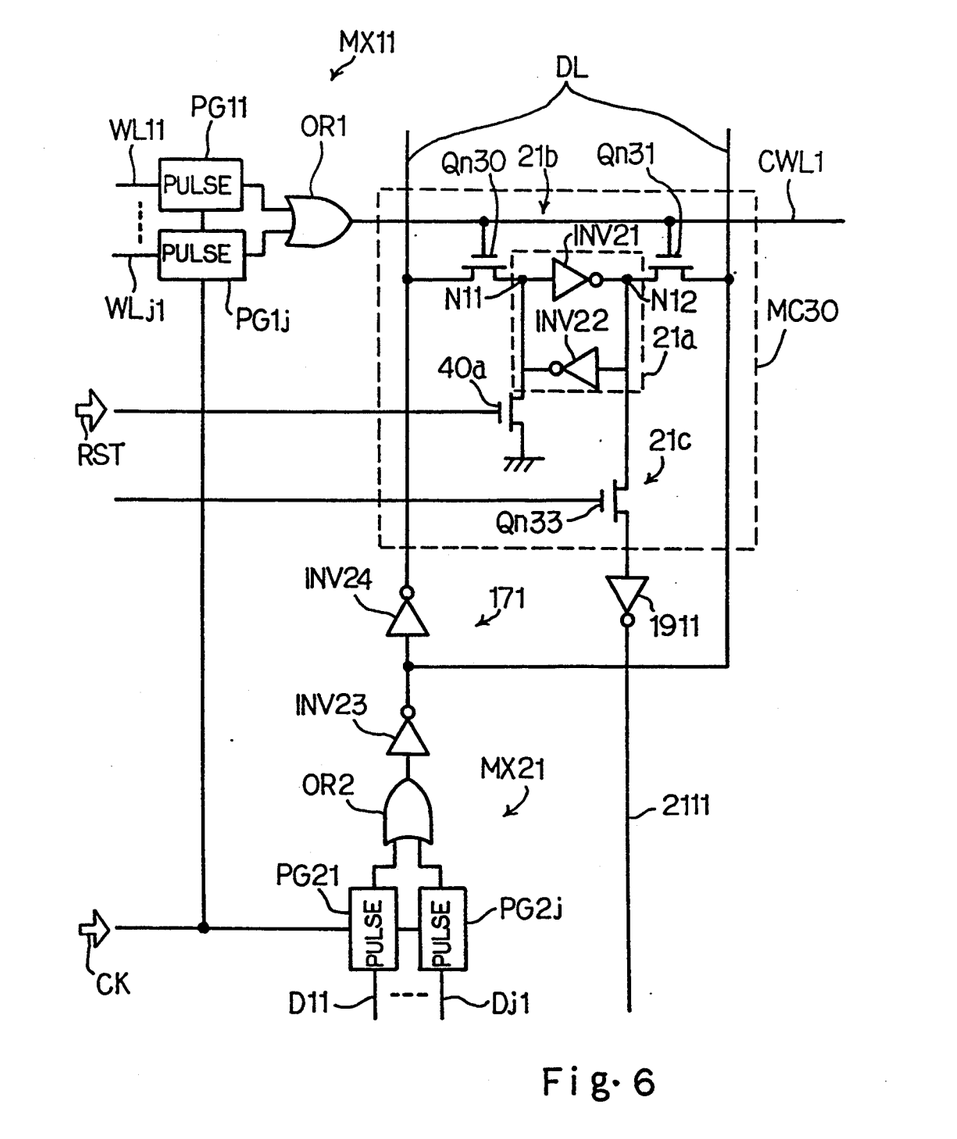
FIG. 6 is a circuit diagram showing the arrangement of another random access memory cell according to the present invention.

Turning to FIG. 6 of the drawings, a random access memory cell MC30 is incorporated in another multi-port random access memory device. The random access memory cell MC30 is equipped with an n-channel enhancement type resetting transistor 40a. However, the other circuit arrangement of the memory cell MC30 and the other units are similar to those of the multi-port random access memory device. For this reason, the other circuit components are labeled with the same references as the corresponding circuit components of the first embodiment without detailed description.

The circuit behaviors in the data access and the write-in sequences are similar to those of the first embodiment, and the n-channel enhancement type resetting transistor 40a of each random access memory cell is turned off.

If the data bits stored in each memory cell is discarded, a reset signal of the high voltage level is supplied to the n-channel enhancement type resetting transistor 40a, and the memory node N11 is forcibly grounded.

Although particular embodiments of the present invention have been shown and described, it will be obvious to those skilled in the art that various changes and modifications may be made without departing from the spirit and scope of the present invention.

What is claimed is:

1. A multi-port random access memory device fabricated on a semiconductor chip, comprising:

a) a plurality of addressable memory cells for storing data bits in a rewritable manner, and each having a-1) a memory circuit for storing one of said data bits, a-2) a single input port coupled to said memory circuit and responsive to a write address signal on a common word line for transferring a write-in data bit to said memory circuit, and a-3) an output port coupled to said memory circuit and responsive to a read address signal for delivering said data bit from said memory circuit;

b) a plurality of sets of word lines respectively driven with a plurality of write address signals for independently addressing said plurality of addressable memory cells, and rearranged into a plurality of groups of word lines, each of the word lines of each group being selected from one of said plurality sets of word lines for addressing one of said plurality of addressable memory cells;

c) a plurality of sets of write-in data paths respectively associated with said plurality of sets of word lines for propagating a plurality of write-in data bits to said plurality of addressable memory cells independently from one another, and rearranged into a plurality of groups of write-in data paths, each of the write-in data paths of each group being selected from one of said plurality of sets of write-in data paths for one of said plurality of addressable memory cells;

d) a plurality of first multiplexers respectively associated with said plurality of groups of word lines, and each responsive to a clock signal for producing said write-in address signal from each of said plurality of write address signals; and e) a plurality of second multiplexers respectively associated with said plurality of groups of write-in data paths, and each responsive to said clock signal for producing said write-in data bit from each of said plurality of write-in data bits in synchronism with said plurality of first multiplexers.

2. The multi-port random access memory device as set forth in claim 1, in which each of said first multiplexer comprises a plurality of first one-shot pulse generators respectively coupled to the word lines of the associated group and enabled with said clock signal, and a logic gate for transferring an one-shot pulse from one of said plurality of first one-shot pulse generators to the associated common word line as said write address signal.

3. The multi-port random access memory device as set forth in claim 2, in which said logic gate is an OR gate.

4. The multi-port random access memory device as set forth in claim 2, in which each of said second multiplexers comprises a plurality of second one-shot pulse generators respectively coupled to the write-in data paths of the associated group and enabled with said clock signal in a synchronous manner with said plurality of first one-shot pulse generators, and a logic gate for transferring the one of the one-shot pulses from the second one-shot pulse generator to said single input port as said write-in data bit.

5. The multi-port random access memory device as set forth in claim 4, in which said logic gate of each second multiplexer is an OR gate.

6. The multi-port random access memory device as set forth in claim 1, in which each of said plurality of addressable memory cells further comprises a resetting transistor for resetting the data bit stored in said memory circuit.

* * * * *

UNITED STATES PATENT AND TRADEMARK OFFICE
CERTIFICATE OF CORRECTION

PATENT NO. : 5,430,685
DATED : July 4, 1995
INVENTOR(S) : Toshio NAKADA

It is certified that error appears in the above-indentified patent and that said Letters Patent is hereby corrected as shown below:

Column 5, line 37, after "circuit" insert --21a--.

Column 5, line 55, delete "WL11" and insert --WLi1--.

Signed and Sealed this

Sixth Day of August, 1996

Attest:

BRUCE LEHMAN

*Attesting Officer*          *Commissioner of Patents and Trademarks*